3,502,489
Patented Mar. 24, 1970

3,502,489

METALIZING COMPOSITIONS FIREABLE IN AN INERT ATMOSPHERE

George Rolland Cole, Wilmington, Del., assignor to E. I. du Pont de Nemours and Company, Wilmington, Del., a corporation of Delaware No Drawing. Filed Apr. 28, 1967, Ser. No. 634,455
Int. Cl. C09d 5/00
U.S. Cl. 106—1 7 Claims

ABSTRACT OF THE DISCLOSURE

Metalizing compositions comprising a noble metal(s) and a particular inorganic binder consisting essentially of a glass composed of $TiO_2$, $SiO_2$, $Na_2O$, $Li_2O$, BaO, $K_2O$, $B_2O_3$, and $Sb_2O_3$ in critical proportionate amounts. These compositions are fired in an inert atmosphere on a dielectric ceramic substrate to form thereon electrically conductive, adherent, and solderable fired-on films.

BACKGROUND OF THE INVENTION

Modern electronic circuitry emphasizes compactness of component assemblies, to which metalizing compositions are an important adjunct. Small assemblies of electronic components are fastened to a ceramic plate, or substrate, and interconnected by means of electrode or conductor lines printed and fired onto the ceramic substrate. Such printed conductors are mechanically strong and resistant to thermal shock and atmospheric contaminants. In particular, noble metal-containing metalizing compositions and electrodes therefrom are of particular importance. An essential advantage conferred by the nozle metal metalizing composition over ordinary, non-noble metal compositions is the capability to be fired in air at high temperatures without being oxidized, thereby retaining good electrical conductivity while maintaining a surface that can be soldered.

Metalizing compositions normally contain, in addition to noble metals, an inorganic binder. The inorganic binder functions primarily to bind together the particulate noble metals and also cause the metals to adhere to the ceramic substrate. The binder is usually a powdered glass and the nature of the glass may dictate appropriate environmental conditions. Also, the quantity of the glass must be sufficient for good adhesion but not in such great quantities as to prevent soldering to the fired-on conductive film. In the usual applications, the noble metal-glass metalizing compositions are fired in air at temperatures ranging from 700–1000° C.

It is common for situations to arise where special component parts of the electronic sub-system require firing in an inert atmosphere (e.g., nitrogen or argon). The purpose of the inert atmosphere is to exclude atmospheric oxygen and prevent the oxygen from oxidizing some part of the system which would be damaged by oxidation. The common noble metal-glass metalizing compositions commonly available are damaged by firing in inert gas; the fired-on films therefrom typically exhibit one or more of the following undesirable characteristics: high electrical resistivity, poor adhesion to the substrate, and bad solderability. Frequently, the surface of the fired-on film has a crazed or roughened appearance.

Therefore, a definite need exists for metalizing compositions which can be fired in an inert atmosphere on a dielectric ceramic substrate to form thereon electrically conductive, fired-on films which have good adherence to the substrate and good solderability properties.

SUMMARY OF THE INVENTION

This invention relates to metalizing compositions adapted to be fired in an inert atmosphere on a dielectric ceramic substrate to form thereon an electrically conductive, adherent and solderable fired-on film, said composition consisting essentially of 70–97% by weight of finely divided noble metal(s) selected from the group consisting of platinum, palladium, silver, gold, rhodium, iridium, alloys of two or more thereof, and mixtures of two or more thereof, and 3–30% by weight finely divided inorganic binder, said binder consisting essentially of a glass composed of:

| | Percent by wt. |
|---|---|
| $TiO_2$ | 22–35 |
| $SiO_2$ | 14–29 |
| $Na_2O$ | 17–26 |
| $Li_2O$ | 1–3 |
| BaO | 0–30 |
| $K_2O$ | 0–11 |
| $B_2O_3$ | 0–11 |
| $Sb_2O_3$ | 0–11 |

It has been found that the use of a glass of the above composition as the inorganic binder of the metalizing composition avoids the usual undesirable effects of inert atmospheric firing. In proper quantities, such a glass provides good adhesion between the fired-on film and ceramic substrate without causing significant loss of electrical conductivity or solderability.

DESCRIPTION OF THE PREFERRED EMBODIMENTS

The finely divided inorganic binder of the present metalizing composition is a glass composition having a particular combination of metallic oxides in critical proportionate amounts as follows:

TABLE I

[Weight percent]

| | Operable | Preferred |
|---|---|---|
| $TiO_2$ | 22–35 | 24–30 |
| $SiO_2$ | 14–29 | 20–28 |
| $Na_2O$ | 17–26 | 20–24 |
| $Li_2O$ | 1–3 | 1–3 |
| BaO | 0–30 | 5–10 |
| $K_2O$ | 0–11 | 5–10 |
| $B_2O_3$ | 0–11 | 1–5 |
| $Sb_2O_3$ | 0–11 | 1–5 |

The above particular combination of metal oxides in the above proportions are necessary to produce inorganic binders which are useful in metalizing compositions fireable in inert atmospheres.

While this invention is not based on any particular theory, it appears that the inorganic binder should only contain metal oxides which are not "easily" reducible to the metal when heated in an inert atmosphere. For example, the common lead oxide glasses cannot be fired in inert atmospheres. It is theorized that the lead oxide reduces at least partially to metallic lead which results in the formation of a very poor inorganic binder. Strictly speaking, $TiO_2$ is an oxide which can be reduced to the metal. However, it is not "easily" reduced to the metal since strenuous efforts and controlled conditions are required to reduce $TiO_2$. $TiO_2$, $SiO_2$, $Na_2O$, and $Li_2O$ constituents are always present in the glass of the inorganic binders of this invention. These constituents produce inorganic binders which, when used in fired-on films, import good adhesion and solderability to the fired-on films.

The BaO, KO, $B_2D_3$, and $Sb_2O_3$ are the optional constituents of the glass but are preferably present in the binder to give added stability and to broaden the temperature range at which the glass softens.

The metal portion of the metalizing composition consists of one noble metal, a mixture of one or more noble metals, an alloy of two or more noble metals, and mixtures thereof. Platinum, palladium, silver, gold, rhodium, and iridium are the noble metals utilized for purposes of this invention. The use of noble metal mixtures commonly employed in conductor metalizing compositions (e.g., palladium-gold, palladium-silver, platinum-gold, platinum-silver) are preferred.

All of the noble metal and inorganic binder components should generally be in a finely divided or powder form, i.e., in the form of powders sufficiently finely divided to pass through a 325 mesh (standard sieve scale) stencil screen, said powder having particles no larger than about 40 microns. Generally, the powder will have an average particle size not exceeding 20 microns. Desirably, the average particle size of the metals will range from 0.1 to 5 microns while an average particle size range of 1 to 15 microns for the inorganic binder is preferred.

The powders may be obtained through conventional methods, such as chemical precipitation or mechanical comminution. For example, finely divided metal powders may be produced by reduction and/or precipitation. The inorganic binder powders are generally prepared by melting a glass batch composed of the desired metal oxides, or compounds which yield the oxides during melting, and pouring the melt into water. This produces a coarse frit which is then milled (e.g., in a ball mill with water) to the desired fineness.

The inorganic binder:metal ratio has an effect on the conductivity, the adhesion and the solderability of the fired-on films. As the proportionate amount of binder increases, the adhesion also increases; but the conductivity, and solderability decrease in the films. A proper balance must be maintained between the conductivity, adhesion, and solderability. The metalizing compositions of this invention should contain from 70–97% by weight finely divided noble metal and, correspondingly, from 3–30% by weight finely divided inorganic binder. At least 3% inorganic binder is necessary to provide adequate adhesion of the fired-on metalizing composition to the substrate. On the other hand, the use of more than 30% by weight inorganic binder provides fired-on films which possess high resistivity values and which are not readily solderable.

The metalizing compositions of the invention will generally, although not necessarily, be dispersed in an inert vehicle to form a paint or paste for application to the dielectric ceramic substrate. The proportion of the metalizing composition to vehicle may vary considerably depending upon the manner in which the paint or paste is to be applied and the kind of vehicle used. Generally, from 1 to 20 parts by weight of metalizing composition (metals and inorganic binder) per part by weight of vehicle will be used to produce a paint or paste of the desired consistency. Preferably, 3 to 10 parts of metalizing composition per part of vehicle will be used.

Any liquid, preferably inert, may be employed as the vehicle. Water or any one of various organic liquids, with or without thickening and/or stabilizing agents, and/or other common additives, may be utilized as the vehicle. Examples of organic liquids that can be used are the higher alcohols such as decanol; esters of the lower alcohols, for example the acetates and propionates; the terpenes such as pine oil, alpha- and beta-termineol and the like; and solutions of resins such as the polymethacrylates of lower alcohols, or solutions of ethyl cellulose, in solvents such as pine oil or the monobutyl ether of ethylene glycol monoacetate (butyl-O—$CH_2CH_2$—$OOCCH_3$). The vehicle may contain or be composed of volatile liquids to promote fast setting after application; or it may contain waxes, thermoplastic resins, or the like materials which are thermofluid so that the composition may be applied at an elevated temperature to a relatively cold ceramic substrate upon which the composition sets immediately.

The metalizing compositions are conventionally made by admixing the metal(s) and inorganic binder solids in the proportions of 70–97% and 3–30%, respectively, based on their total combined weights. Additionally, one part of an inert vehicle for every 1 to 20 parts of solids mentioned above may be admixed. Then the metalizing composition is applied to a dielectric ceramic substrate and fired to form a conductive film.

Application of the conductive metalizing composition in paint or paste form to the dielectric ceramic substrate may be effected for any desired purpose, e.g., to provide conductive circuit elements or connector elements, and in any desired manner. It will generally be desired, however, to effect the application in precise pattern form, which may be readily done employing well-known screen stencil techniques or methods. Firing will usually be effected at temperatures ranging from 750–1000° C. in an inert atmosphere employing the usual firing lehr.

Any inert atmosphere can be used for purposes of this invention. For example, nitrogen, argon, helium, neon, krypton, or xenon can be utilized.

The invention is illustrated by the following examples. In the examples and elsewhere in the specification all parts, percentages, and proportions of materials or components are by weight.

Various metalizing compositions were prepared employing finely divided noble metals and a finely divided inorganic binder in varying proportions. The finely divided inorganic binder employed in Examples 1–8 consisted of a glass composed of 25.2% $TiO_2$, 27% $SiO_2$, 22.4% $Na_2O$, 1.7% $Li_2O$, 11.1% BaO, 9.2% $K_2O$, 1.7% $B_2O_3$, and 1.7% $Sb_2O_3$. Other types of glasses, as indicated in Table II, were employed as binders in Examples 9–13. The noble metals and inorganic binder were suspended in a vehicle consisting of 8% ethyl cellulose and 92% beta-terpineol. The noble metal powders had particle sizes ranging from 0.01 to 10 microns, with an average size of about 0.2 micron. The inorganic binders had particle sizes ranging from about 1 to 40 microns, with an average size of about 10 microns. The dispersions of noble metals and binder in the vehicle were roll-milled and printed through a stainless steel screen onto 96% alumina substrates; the printed substrates were fired at temperatures ranging from 750–970° C. (as indicated) in flowing nitrogen for 5 to 14 minutes (as indicated).

Solderability determinations were made by dipping the printed and fired ceramic substrate into a hot solder bath containing 62% tin, 36% lead, and 2% silver. The results were visually observed, noting in particular the quality of the solder and the amount of coverage provided by the solder. Under the heading "Solderability," "bad" means either that no soldering could be effected or that solderability was so difficult as to be unacceptable; "fair" means the fired-on coating would accept solder only with difficulty and that isolated spots did not solder, so that acceptability was borderline; while "good" means that the fired-on coating accepted solder readily to give smooth and firm solder joints.

The adhesion property of the fired-on coatings is indicated by the amount of force, in pounds, required to pull a wire lead from the ceramic substarte. Generally, the failure, i.e., complete separation, occurs between the fired-on film and the alumina substrate. The Pull Test values reported in the examples are the averages of several determinations. In determining the adhesion, a Pull Test was performed on the printed alumina chip as follows: A 30 mill (diameter) tinned copper wire was dip soldered onto the printed metalizing composition which was in the form of a solid, conductive disc 7/16" in diameter on the substrate. The copper wire was bent to an angle of 90° in relation to the ceramic substrate. The unattached end of the wire was fastened to a Chatillon Pull Tester which had a scale in pounds. The Pull Tester (having the soldered wire attached thereto) was pulled at the rate of 1½" per minute until the wire separated entirely from the ceramic substrate. The amount of pull required to cause such a separation was recorded in most instances.

Resistance measurement, using a Southwestern (Model C-3) Resistance Meter, were run on paths of "25 squares" of $\frac{1}{16}$" width, except in Examples 12 and 13 where paths of "200 squares" of $\frac{1}{32}$" width were used. These values were recorded whenever they were determined.

2. A metalizing composition in accordance with claim 1 wherein said inorganic binder consists essentially of a glass composed of:

| | Percent by wt. |
|---|---|
| $TiO_2$ | 24–30 |
| $SiO_2$ | 20–28 |
| $Na_2O$ | 20–24 |
| $Li_2O$ | 1–3 |
| $BaO$ | 5–20 |
| $K_2O$ | 5–10 |
| $B_2O_3$ | 1–5 |
| $Sb_2O_3$ | 1–5 |

TABLE II

[Weight percent]

| Example No. | 1 | 2 | 3 | 4 | 5 | 6 | 7 | 8 | 9 | 10 | 11 | 12 | 13 |
|---|---|---|---|---|---|---|---|---|---|---|---|---|---|
| Metalizing Comp., percent: | | | | | | | | | | | | | |
| Gold | 57.9 | 57.9 | 57.9 | 57.9 | 56.4 | 59.5 | 56.0 | 0 | 55 | 0 | 55 | 57.5 | 57.5 |
| Platinum | 15.8 | 15.8 | 15.8 | 15.8 | 15.4 | 16.2 | 0 | 0 | 0 | 0 | 15 | 15.7 | 15.7 |
| Palladium | 0 | 0 | 0 | 0 | 0 | 0 | 15.3 | 22.3 | 15 | 22.2 | 0 | | 0 |
| Silver | 0 | 0 | 0 | 0 | 0 | 0 | 0 | 40.7 | 0 | 40.5 | 0 | 0 | 0 |
| Inorganic Binder | 7.9 | 7.9 | 7.9 | 7.9 | 10.3 | 5.4 | 10 | 11.0 | [2] 11.2 | [2] 11.2 | [4] 12.5 | [5] 8.0 | [6] 8.0 |
| Vehicle | 18.4 | 18.4 | 18.4 | 18.4 | 17.9 | 18.9 | 18.7 | 26.9 | 18.8 | 26.1 | 17.5 | 18.8 | 18.8 |
| Firing time: | | | | | | | | | | | | | |
| Minutes | 10 | 14 | 10 | 5 | 10 | 10 | 10 | 10 | 10 | 10 | 10 | 10 | 10 |
| Temp., ° C | 800 | 800 | 900 | 979 | 900 | 900 | 900 | 900 | 900 | 900 | 900 | 900 | 900 |
| Solderability | Good | Good | Good | Fair | Fair | Fair | Good | Good | Good | Good | Bad | Bad | Fair |
| Adhesion (lbs.) | Good | [1] 3.2 | [1] 4.4 | Good | [1] 5.1 | Good | [1] 1.8 | [1] 2.5 | [3] 0.1 | [3] 0.1 | (7) | (7) | 0.4 |
| Resistance (ohms/square) | 0.064 | N.D. | N.D. | 0.080 | 0.112 | 0.08 | N.D. | N.D. | N.D. | N.D. | 0.72 | 0.061 | ∞ |

N.D. indicates not determined.
[1] Good.
[2] The inorganic binder consisted of 4 parts $Bi_2O_3$ and 1 part glass composed of 63.1% CdO, 16.7% $B_2O_3$, 12.8% $SiO_2$, 7.4% $Na_2O$.
[3] Bad.
[4] The inorganic binder was a glass composed of 22.9% $SiO_2$, 16.5% $B_2O_3$, 59.6% PbO, and 1% CuO.
[5] The inorganic binder was binder was a glass composed of 63.1% CdO, 16.7% $B_2O_3$, 12.8% $SiO_2$, and 7.4% NaO.
[6] The inorganic binder was a glass composed of 65% PbO, 25% $SiO_2$, and 10% $B_2O_3$.
[7] Not determined because it could not be soldered.

It can be seen from the tabulated data that the metalizing composition of Examples 1–8, i.e., those coming within the scope of this invention, are well suited for use in making fired-on conductive films having highly desirable soldering, adhesion, and electrical characteristics. In contrast, the composition of Examples 9–13, which contained the common inorganic binders, gave fired-on films which exhibited one or more of the following undesirable characteristics: high electrical resistance, insufficient adhesion to the substrate, and bad solderability with the common lead-tin solder previously described.

Since it is obvious that many changes and modifications can be made in the above-described details without departing from the nature and spirit of the invention, it is to be understood that the invention is not to be limited to said details except as set forth in the appended claims.

What is claimed is:

1. A metalizing composition adapted to be fired in an inert atmosphere on a dielectric ceramic substrate to form thereon an electrically conductive, adherent, and solderable fired-on film, said composition consisting essentially of 70–97% by weight finely divided noble metal(s) selected from the group consisting of platinum, palladium, silver, gold, rhodium, iridium, alloys of two or more thereof, and mixtures of two or more thereof, and 3–30% by weight finely divided inorganic binder, said binder consisting essentially of a glass composed of:

| | Percent by wt. |
|---|---|
| $TiO_2$ | 22–35 |
| $SiO_2$ | 14–29 |
| $Na_2O$ | 17–26 |
| $Li_2O$ | 1–3 |
| $BaO$ | 0–30 |
| $K_2O$ | 0–11 |
| $B_2O_3$ | 0–11 |
| $Sb_2O_3$ | 0–11 |

3. A metalizing composition in accordance with claim 1 wherein said inorganic binder consists essentially of a glass composed of:

| | Percent by wt. |
|---|---|
| $TiO_2$ | 25.2 |
| $SiO_2$ | 27.0 |
| $Na_2O$ | 22.4 |
| $Li_2O$ | 1.7 |
| $BaO$ | 11.1 |
| $K_2O$ | 9.2 |
| $B_2O_3$ | 1.7 |
| $Sb_2O_3$ | 1.7 |

4. A dispersion of the metalizing composition according to claim 1 in an inert liquid vehicle.

5. A dispersion of the metalizing composition according to claim 2 in an inert liquid vehicle.

6. A dielectric ceramic substrate having printed and fired thereon in an inert atmosphere the metalizing composition of claim 1.

7. A dielectric ceramic substrate having printed and fired thereon in an inert atmosphere the metalizing composition of claim 2.

References Cited

UNITED STATES PATENTS

| | | | |
|---|---|---|---|
| 2,911,312 | 11/1959 | Hoffman | 106—48 |
| 3,293,501 | 12/1966 | Martin | 252—514 XR |
| 3,374,110 | 3/1968 | Miller | 117—227 XR |

JULIUS FROME, Primary Examiner

LORENZO B. HAYES, Assistant Examiner

U.S. Cl. X.R.

117—123, 124, 227; 252—514